(12) United States Patent
Matsuwake et al.

(10) Patent No.: US 8,659,361 B2
(45) Date of Patent: Feb. 25, 2014

(54) FUNCTION GENERATOR CIRCUIT

(75) Inventors: Ryosuke Matsuwake, Tokyo (JP);
Minoru Sakai, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 33 days.

(21) Appl. No.: 13/302,043

(22) Filed: Nov. 22, 2011

(65) Prior Publication Data
US 2012/0133451 A1 May 31, 2012

(30) Foreign Application Priority Data

Nov. 29, 2010 (JP) ................................ 2010-265630

(51) Int. Cl.
*H03B 5/32* (2006.01)
*H03L 1/02* (2006.01)

(52) U.S. Cl.
USPC .............................. 331/66; 331/158; 331/176

(58) Field of Classification Search
CPC .......... H03B 5/32; H03B 5/366; H03B 5/368; H03B 5/04
USPC ................... 331/176, 66, 116 R, 116 FE, 158
See application file for complete search history.

(56) References Cited

U.S. PATENT DOCUMENTS

| | | | | |
|---|---|---|---|---|
| 7,253,694 B2 * | 8/2007 | Hardy et al. | .................. | 331/176 |
| 7,633,350 B2 * | 12/2009 | Nagatomo et al. | ............. | 331/176 |
| 7,808,333 B2 * | 10/2010 | Takeuchi et al. | .............. | 331/158 |
| 2006/0152294 A1 | 7/2006 | Kawasaki et al. | | |
| 2008/0007363 A1 | 1/2008 | Nagatomo et al. | | |

FOREIGN PATENT DOCUMENTS

| | | | |
|---|---|---|---|
| JP | 8-116214 | | 5/1996 |
| JP | 08116214 A | * | 5/1996 |
| JP | 2005-295014 A | | 10/2005 |
| JP | 2007-325033 | | 12/2007 |
| JP | 4070139 | | 4/2008 |
| JP | 2008294623 A | * | 12/2008 |
| JP | 2010-206443 A | | 9/2010 |

OTHER PUBLICATIONS

Japanese Office Action dated Jan. 4, 2011.

* cited by examiner

*Primary Examiner* — Ryan Johnson
(74) *Attorney, Agent, or Firm* — IPUSA, PLLC

(57) ABSTRACT

A function generator circuit includes a temperature detecting circuit outputting a detection voltage corresponding to an ambient temperature and having a linear temperature characteristic. Zeroth-order, first-order and second-order component generating circuits generate a zeroth-order component, a first-order component and a second-order component, respectively, of the control signal. A third-order component generating circuit generates a third-order component of the control signal based on the detection voltage. An adder-subtractor generates the control signal by obtaining a sum of the zeroth-order component, the first-order component, and the third-order component and adding or subtracting the second-order component to or from the sum. The second-order component generating circuit corrects a temperature at an inflection point of the control signal.

13 Claims, 15 Drawing Sheets

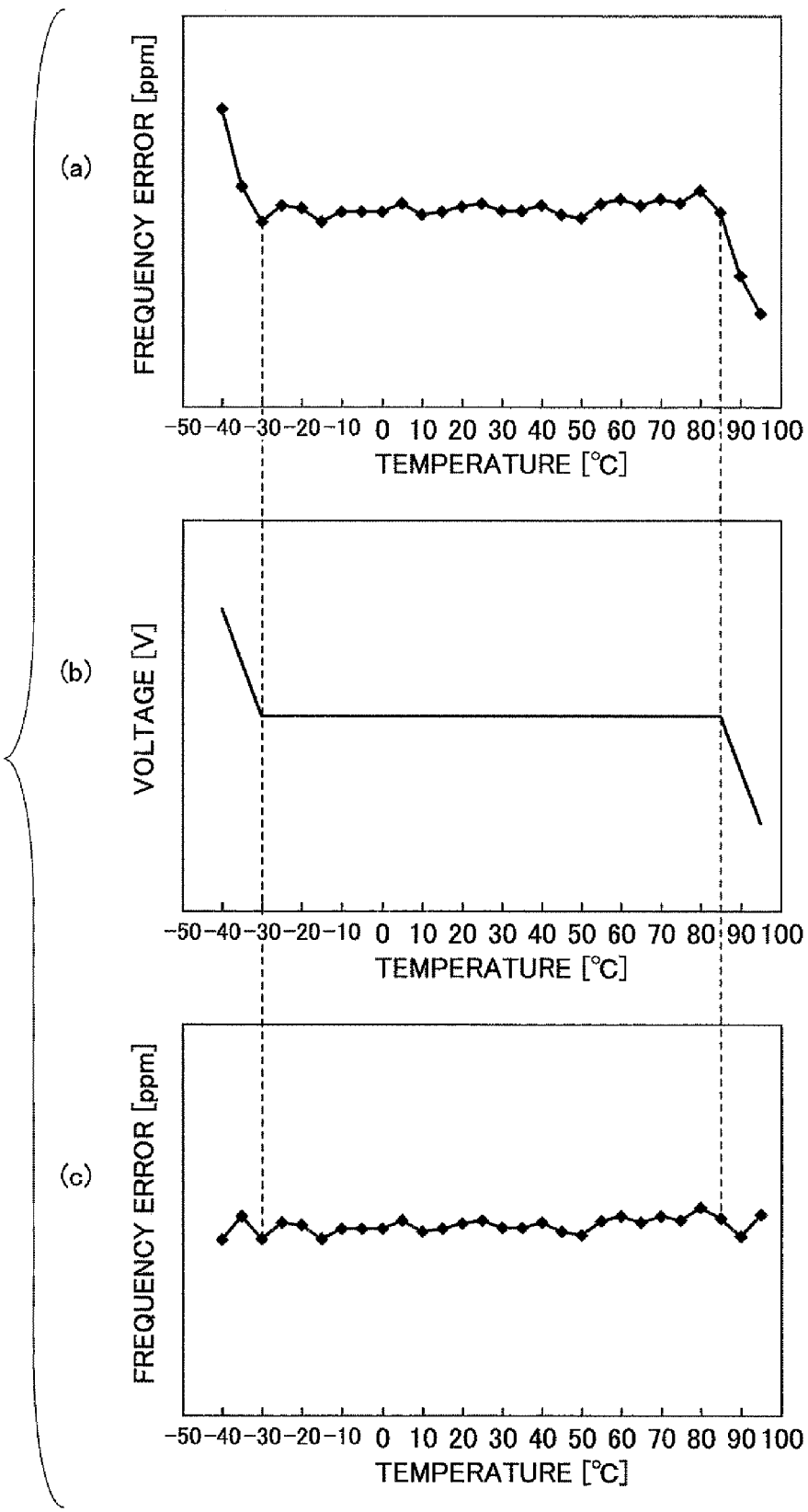

FUNCTION GENERATOR CIRCUIT

CROSS-REFERENCE TO RELATED APPLICATION

The present application is based upon and claims the benefit of priority of Japanese Patent Application No. 2010-265630, filed on Nov. 29, 2010, the entire contents of which are incorporated herein by reference.

BACKGROUND OF THE INVENTION

1. Field of the Invention

An aspect of this disclosure relates to a function generator circuit.

2. Description of the Related Art

FIG. 1 is a circuit diagram of a temperature-compensated crystal oscillator (TCXO) 50 including a temperature compensating circuit 20 that functions as a function generator circuit. The temperature compensating circuit 20 outputs a control voltage Vc for an oscillating circuit 30 that causes an AT-cut quartz crystal 35 to oscillate. The TCXO 50 is implemented as an integrated circuit (IC). An oscillation frequency f of the quartz crystal 35 has a temperature characteristic represented by a cubic curve as illustrated in FIG. 2. When f0 indicates a natural resonance frequency at the temperature at an inflection point of the cubic curve, the vertical axis in FIG. 2 indicates a frequency error ($\Delta$ f/f0) in the natural resonance frequency f0 caused by a temperature change. The temperature characteristic of the oscillation frequency f of the quartz crystal 35 is represented by a cubic function of formula (1) below.

$$f = a(T-T0)^3 + b(T-T0) + c \qquad (1)$$

In formula (1), "T" indicates a (ambient) temperature, "T0" indicates a temperature (central reference temperature or inflection point temperature) at the inflection point of the cubic curve, "a" indicates a coefficient for the third-order (cubic) term, "b" indicates a slope coefficient of the temperature characteristic, and "c" indicates an offset coefficient of the oscillation frequency f.

To prevent or reduce variations in the oscillation frequency f due to temperature changes, the oscillating circuit 30 includes variable-capacitance elements 31 and 32 for adjusting the oscillation frequency f. The control voltage Vc that varies depending on the ambient temperature T is applied to the variable-capacitance elements 31 and 32. The temperature compensating circuit 20 generates the control voltage Vc based on the ambient temperature T and applies the generated control voltage Vc to the variable-capacitance elements 31 and 32 to offset the temperature characteristic of the oscillation frequency f of the quartz crystal 35 and thereby compensate for the variation in the oscillation frequency f of the quartz crystal 35 caused by a temperature change.

The control voltage Vc is obtained by adding voltages generated by a third-order component generating circuit 6, a first-order component generating circuit 5, and a zeroth-order component generating circuit 4 and is approximated by a cubic function represented by formula (2) below.

$$Vc = \alpha(T-T0)^3 + \beta(T-T0) + \gamma \qquad (2)$$

In formula (2), $\alpha$ indicates a coefficient of the third-order term, $\beta$ indicates a coefficient of the first-order term, and $\gamma$ indicates a coefficient of the zeroth-order term. Defining a cubic function using T0 as in formula (2) makes it possible to omit the second-order term and thereby makes it possible to reduce the size of the temperature compensating circuit 20.

The variations in the oscillation frequency f of the quartz crystal 35 due to temperature changes can be compensated for by adjusting $\alpha$, $\beta$, $\gamma$, and T0 in formula (2).

A T0 adjusting circuit 3 adjusts T0. The T0 adjusting circuit 3 adjusts T0 in formula (2) to match a temperature at the inflection point that is determined by the temperature characteristic of the quartz crystal 35.

Technologies related to function generator circuits are disclosed, for example, in Japanese Patent No. 4070139, Japanese Laid-Open Patent Publication No. 2007-325033, and Japanese Laid-Open Patent Publication No. 08-116214.

Here, as illustrated in FIGS. 3 (a) and (b), even if the inflection point temperature T0 is adjusted by the T0 adjusting circuit 3, the temperature at the inflection point of the control voltage Vc actually generated by a function generator circuit may be shifted from T0 to T0' due to manufacturing variations of the function generator circuit. As illustrated in FIG. 3 (c), such a shift of T0 due to manufacturing variations results in a second-order component in the oscillation frequency f that has been corrected by the control voltage Vc.

SUMMARY OF THE INVENTION

In an aspect of this disclosure, there is provided a function generator circuit for outputting a control signal to an oscillating circuit that causes a quartz crystal to oscillate. The function generator circuit includes a temperature detecting circuit configured to output a detection voltage corresponding to an ambient temperature and having a linear temperature characteristic; a zeroth-order component generating circuit configured to generate a zeroth-order component of the control signal; a first-order component generating circuit configured to generate a first-order component of the control signal; a second-order component generating circuit configured to generate a second-order component of the control signal; a third-order component generating circuit configured to generate a third-order component of the control signal based on the detection voltage; and an adder-subtractor configured to generate the control signal by obtaining a sum of the zeroth-order component, the first-order component, and the third-order component and adding or subtracting the second-order component to or from the sum. The second-component generating circuit is configured to correct a temperature at an inflection point of the control signal.

BRIEF DESCRIPTION OF THE DRAWINGS

FIG. 6B is a drawing used to describe compensation of frequency errors in a high-temperature range and a low-temperature range;

DESCRIPTION OF THE PREFERRED EMBODIMENTS

Preferred embodiments of the present invention are described below with reference to the accompanying drawings.

Figure 1:
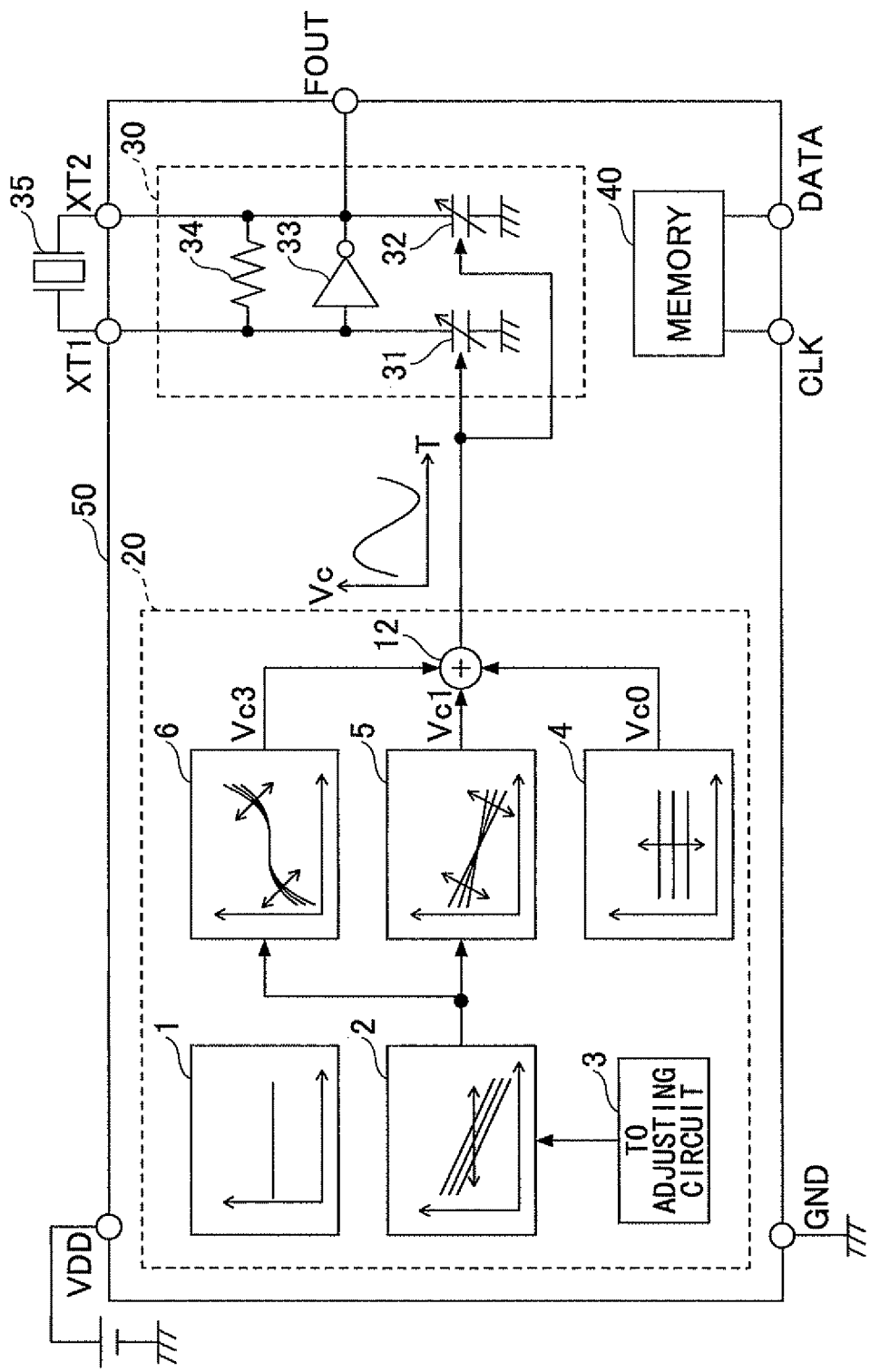
FIG. 1 is a circuit diagram of a temperature-compensated crystal oscillator including a temperature compensating circuit that functions as a function generator circuit.
Figure 2:
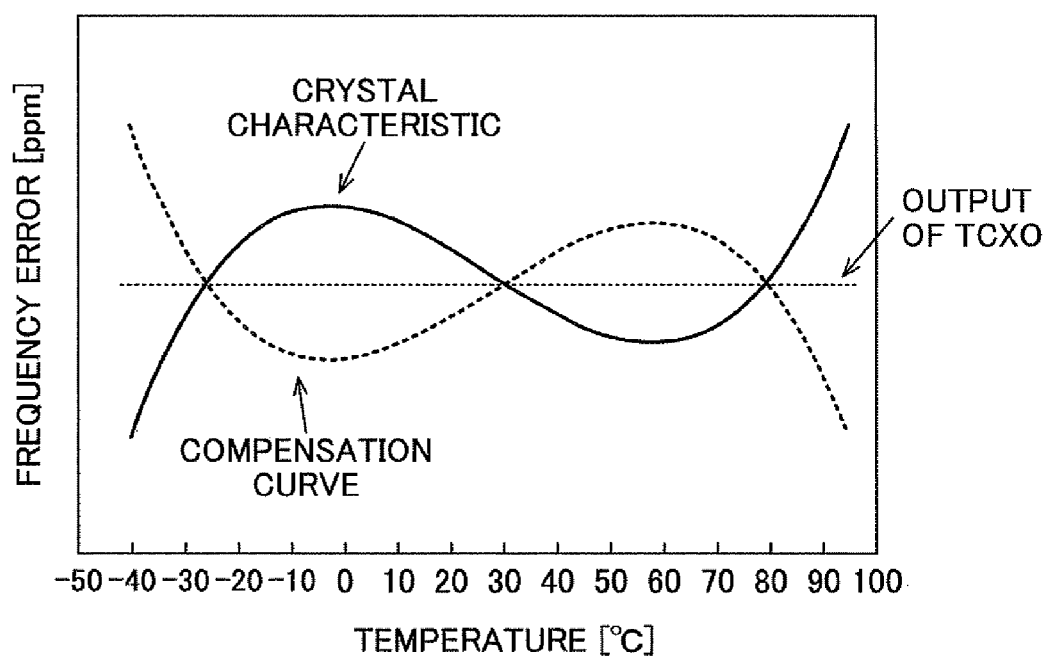
FIG. 2 is a graph used to describe compensation of variations in an oscillation frequency.
Figure 4:
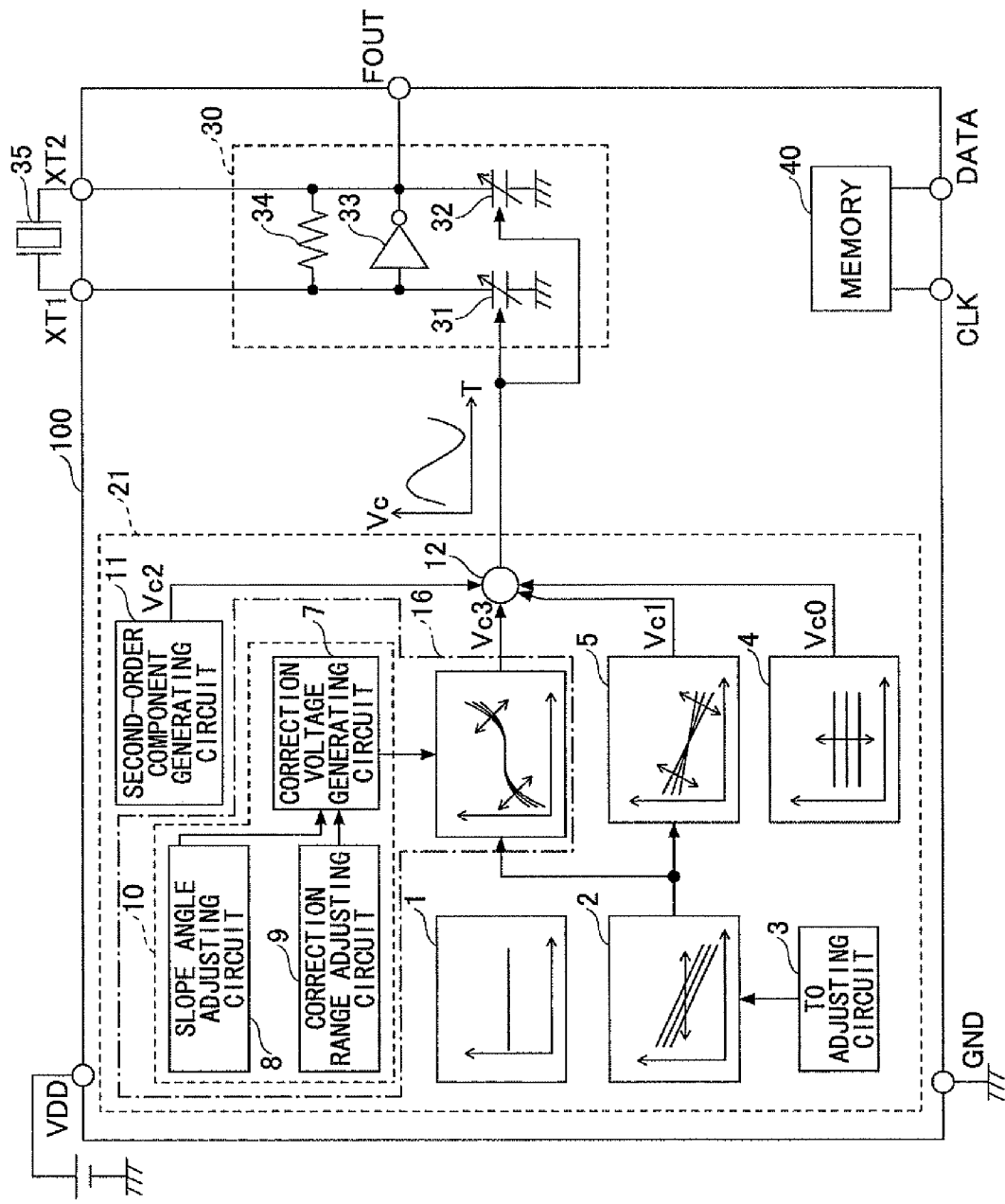
FIG. 4 is a drawing illustrating an exemplary configuration of a temperature-compensated crystal oscillator according to a first embodiment.

FIG. 4 is a drawing illustrating an exemplary configuration of a temperature-compensated crystal oscillator (TCXO) 100 according to a first embodiment. Descriptions of components in FIG. 4 that correspond to those in FIG. 1 are omitted here. The TCXO 100 may be implemented as an integrated circuit (IC).

The TCXO 100 may include a temperature compensating circuit 21, an oscillating circuit 30 for causing an AT-cut quartz crystal 35 to oscillate, and a memory 40. The temperature compensating circuit 21 is a function generator circuit that outputs a control voltage Vc to the oscillating circuit 30. The oscillating circuit 30 may include a CMOS inverter 33, a variable-capacitance element 31 connected between the input terminal of the CMOS inverter 33 and the ground, a variable-capacitance element 32 connected between the output terminal of the CMOS inverter 33 and the ground, and a resistor 34 connected between the input and output terminals of the CMOS inverter 33 in parallel with the CMOS inverter 33. The quartz crystal 35 is also connected between the input and output terminals of the CMOS inverter 33 in parallel with the CMOS inverter 33. The variable-capacitance elements 31 and 32 may be implemented, for example, by variable-capacitance diodes (varicaps). The oscillating circuit 30 outputs an oscillation frequency f from a terminal FOUT according to the control voltage Vc applied to the variable-capacitance elements 31 and 32. The memory 40 stores data used by the temperature compensating circuit 21 to calculate α, β, γ, and T0 in formula (2) above. The data in the memory 40 are rewritable from the outside of the TCXO 100 via a terminal CLK and a terminal DATA. For example, data adjusted for each product may be stored in the memory 40 before the shipment.

In the example of FIG. 4, the quartz crystal 35 is connected via terminals XT1 and XT2 to the TCXO 100 as an external component. The configurations of the quartz crystal 35 and the oscillating circuit 30 are not limited to those illustrated in FIG. 4 as long as they have temperature characteristics represented by formula (1) above.

The temperature compensating circuit 21 may include a reference voltage generating circuit 1, a temperature detecting circuit 2, a T0 adjusting circuit 3, a zeroth-order component generating circuit 4, a first-order component generating circuit 5, a third-order component generating circuit 16, a second-order component generating circuit 11, and an adder-subtractor 12.

The reference voltage generating circuit 1 regulates a direct-current supply voltage input from a terminal VDD with reference to a ground potential at a terminal GND and thereby generates a reference voltage Vref. Multiple constant reference voltages (e.g., a reference voltage V1 described later) with different voltage levels are generated based on the reference voltage Vref generated by the reference voltage generating circuit 1. The reference voltages may be generated, for example, by resistive divider circuits for dividing the reference voltage Vref.

The temperature detecting circuit 2 detects the temperature of the TCXO 100 including the quartz crystal 35 as an ambient temperature T and outputs a detection voltage that corresponds to the detected ambient temperature T and has a linear (first-order) temperature characteristic (particularly, a negative linear temperature characteristic). For example, the temperature detecting circuit 2 outputs a detection voltage VT that monotonically decreases as the ambient temperature T increases (i.e., a detection voltage VT having a negative linear temperature characteristic). Alternatively, the temperature detecting circuit 2 may be configured to detect the temperature of the quartz crystal 35.

The T0 adjusting circuit 3 adjusts T0 in formula (2) based on the data stored in the memory 40 to match the temperature at the inflection point that is determined by the temperature characteristic of the quartz crystal 35.

The zeroth-order component generating circuit 4 generates a zeroth-order component Vc0 of the control voltage Vc based on the data stored in the memory 40. The first-order component generating circuit 5 generates a first-order component Vc1 of the control voltage Vc based on the data stored in the memory 40. The third-order component generating circuit 16 generates a third-order component Vc3 of the control voltage Vc based on the data stored in the memory 40 and the detection voltage VT. The second-order component generating circuit 11 generates a second-order component Vc2 of the control voltage Vc based on the data stored in the memory 40. The adder-subtractor 12 obtains a sum of the zeroth-order component Vc0, the first-order component Vc1, and the third-order component Vc3, adds or subtracts the second-order component Vc2 to or from the sum to obtain the control voltage Vc, and outputs the obtained control voltage Vc to the oscillating circuit 30.

Figure 5A:
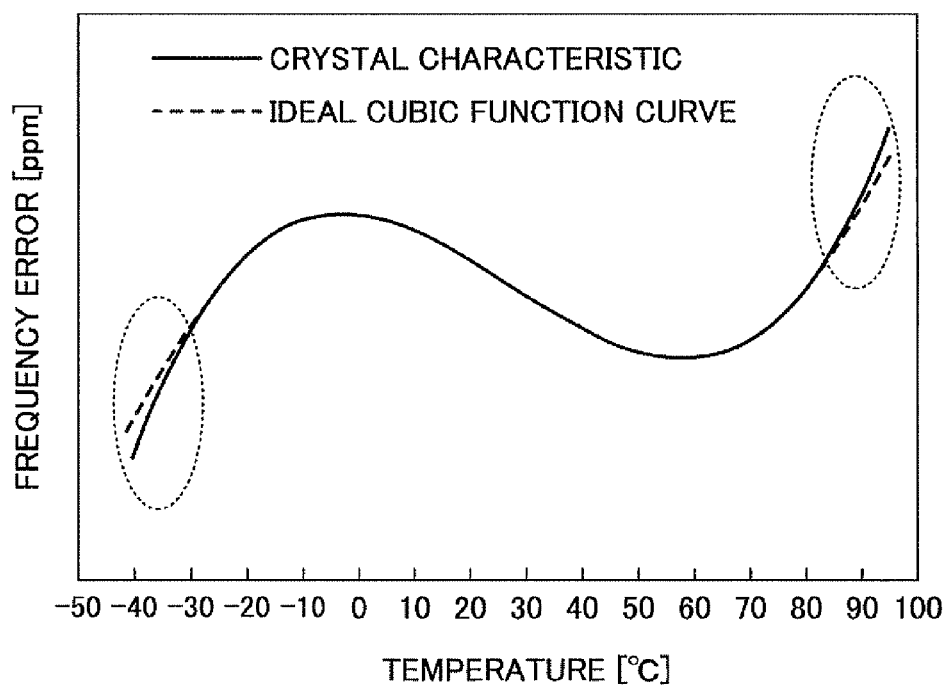
FIG. 5A is a graph illustrating a temperature characteristic of a frequency error.
Figure 5B:
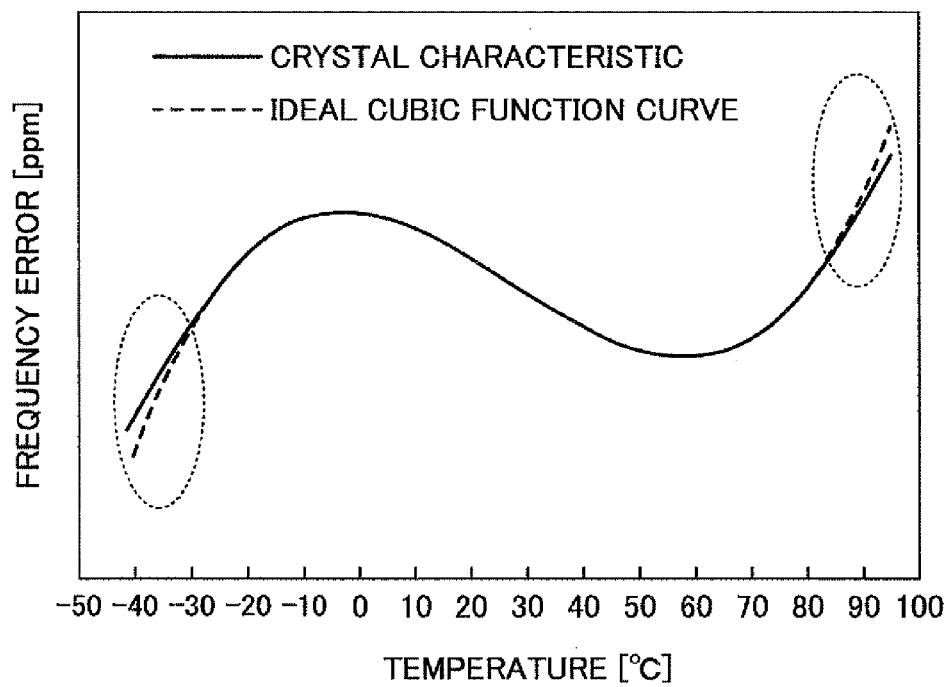
FIG. 5B is a graph illustrating a temperature characteristic of a frequency error.
Figure 6A:
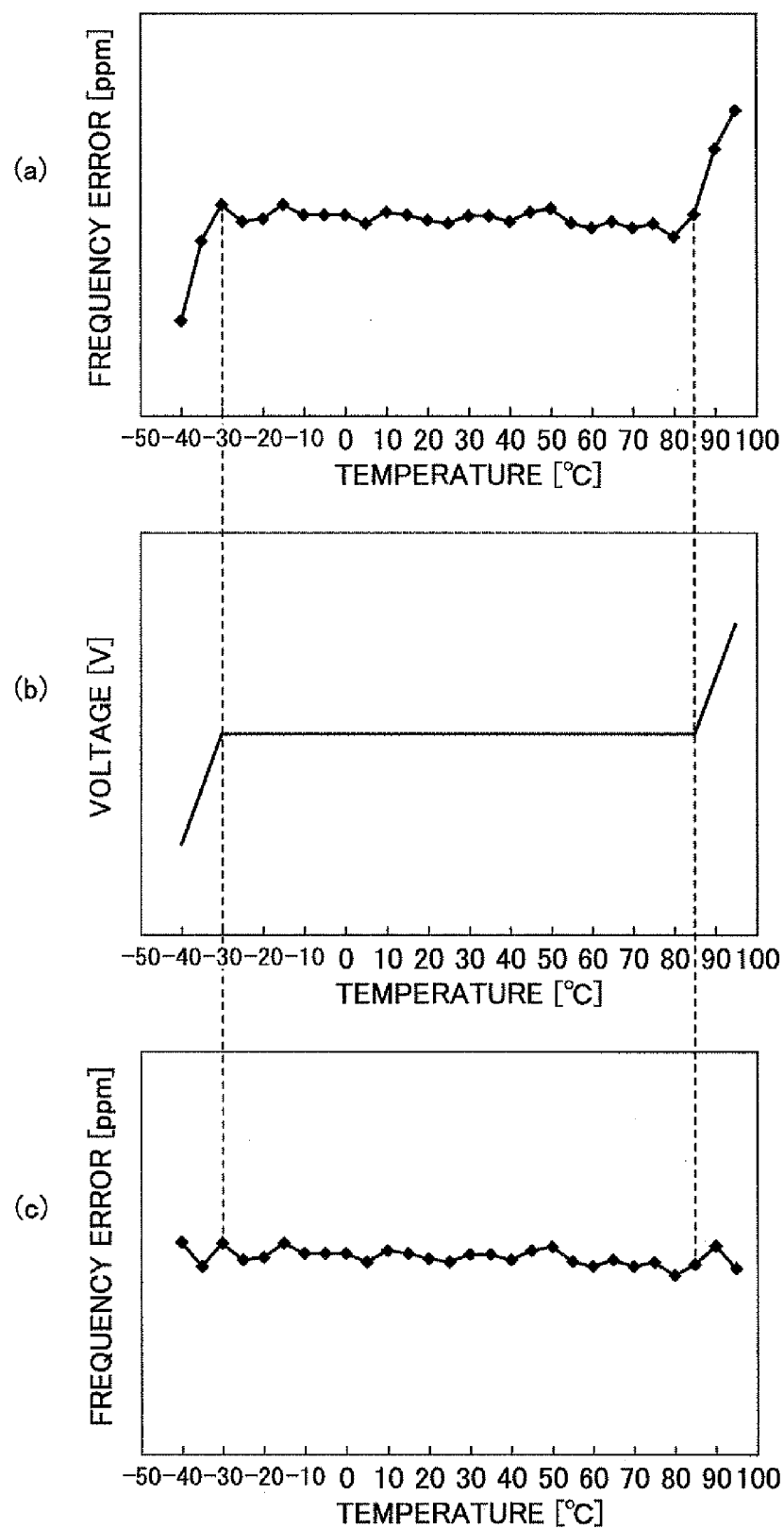
FIG. 6A is a drawing used to describe compensation of frequency errors in a high-temperature range and a low-temperature range.

The third-component generating circuit 16 includes a correction term circuit 10. In the configuration of FIG. 4, the correction term circuit 10 corrects the third-order component Vc3. In other words, the correction term circuit 10 is a higher-order component generating circuit that generates a voltage component of an order higher than that of the third-order component Vc3 of the control voltage Vc based on the data stored in the memory 40. In related-art TCXOs, temperature compensation is typically performed within a temperature range between −30° C. and 85° C. However, there is a demand for increasing the temperature compensation range of TCXOs. Here, in a high-temperature range and a low-temperature range, a quartz crystal exhibits frequency changes as illustrated in FIGS. 5A and 5B that cannot be sufficiently approximated by a cubic function due to, for example, the condition of an adhesive used to bond electrodes to the quartz crystal. Therefore, with a related-art approximation correction method using a cubic function, the frequency errors ($\Delta$ f/f0) in the high-temperature range and the low-temperature range increase as illustrated in FIG. 6A (a) and FIG. 6B (b) if the temperature compensation range is increased and as a result, the compensation accuracy is reduced. To prevent such a problem, the temperature compensating circuit 21 of the embodiment includes the correction term circuit 10 that makes it possible to compensate for variations in the oscillation frequency in the high-temperature range and the low-temperature range where frequency errors in cubic function approximation are greater than a predetermined value.

The correction term circuit 10 includes a correction voltage generating circuit 7. For example, the correction voltage generating circuit 7 outputs correction signals for generating correction voltage components as illustrated in FIG. 6A (b) and FIG. 6B (b) to cancel frequency deviations remaining in a high-temperature range higher than 80° C. and a low-temperature range lower than −30° C. More specifically, the correction voltage generating circuit 7 outputs a correction signal to adjust the correction voltage component to a constant value in a normal temperature range between −30° C. and 80° C. When frequency errors are as illustrated in FIG. 6A (a), the correction voltage generating circuit 7 outputs a high-temperature-side correction signal in the high-temperature range higher than 80° C. to increase the value of the correction voltage component as the temperature increases, and outputs a low-temperature-side correction signal in the low-temperature range lower than −30° C. to decrease the value of the correction voltage component as the temperature decreases. Meanwhile, when frequency errors are as illustrated in FIG. 6B (a), the correction voltage generating circuit 7 outputs a high-temperature-side correction signal in the high-temperature range higher than 80° C. to decrease the value of the correction voltage component as the temperature increases, and outputs a low-temperature-side correction signal in the low-temperature range lower than −30° C. to increase the value of the correction voltage component as the temperature decreases. Thus, the correction voltage generating circuit 7 makes it possible to improve the accuracy of temperature compensation in the high-temperature range and the low-temperature range as illustrated in FIG. 6A (c) and FIG. 6B (c).

Figure 7:
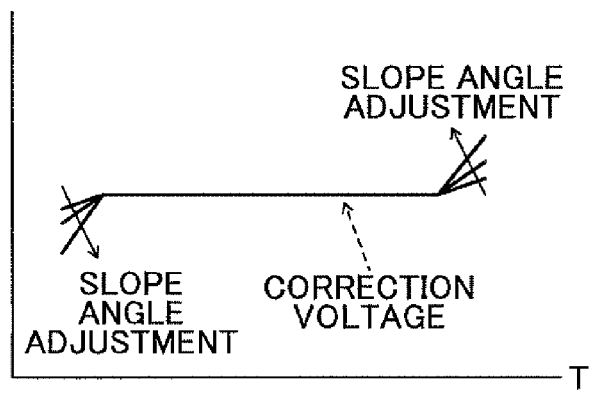
FIG. 7 is a graph used to describe adjustment of slope angles of a correction voltage component.

The correction term circuit 10 also includes a slope angle adjusting circuit 8 that outputs a slope-angle adjusting signal for adjusting slope angles of the correction voltage component, which is generated by the correction voltage generating circuit 7, in the high-temperature range and the low-temperature range. For example, the slope angle adjusting circuit 8 adjusts the slope angles of the correction voltage component in the high-temperature range and the low-temperature range as illustrated in FIG. 7 based on the data stored in the memory 40. Thus, the slope angle adjusting circuit 8 makes it possible to finely adjust the slope angles of the control voltage Vc in the high-temperature range and the low-temperature range and thereby makes it possible to improve the correction accuracy of the oscillation frequency f in the high-temperature range and the low-temperature range.

Figure 8:
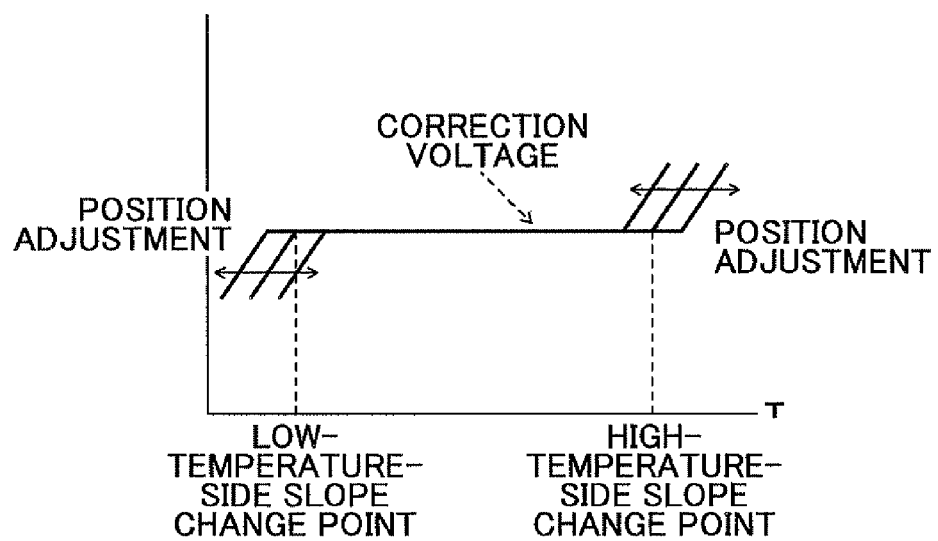
FIG. 8 is a graph used to describe adjustment of positions of slope change points of a correction voltage component.

The correction term circuit 10 further includes a correction range adjusting circuit 9 that outputs a position correction signal to adjust the positions of slope change points where the slope angle of the correction voltage component generated by the correction voltage generating circuit 7 drastically changes and thereby to adjust the temperature range where the correction voltage component is generated by the correction voltage generating circuit 7. For example, the correction range adjusting circuit 9 adjusts one or both of the positions of a low-temperature-side slope change point and a high-temperature-side slope change point as illustrated in FIG. 8 based on the data stored in the memory 40. Alternatively, the correction range adjusting circuit 9 may be configured to adjust both of the positions of the low-temperature-side slope change point and the high-temperature-side slope change point without changing the distance (or difference) between them based on the data stored in the memory 40. Thus, the correction range adjusting circuit 9 makes it possible to finely adjust the slope change points of the control voltage Vc in the high-temperature range and the low-temperature range and thereby makes it possible to improve the correction accuracy of the oscillation frequency f in the high-temperature range and the low-temperature range.

Figure 9:
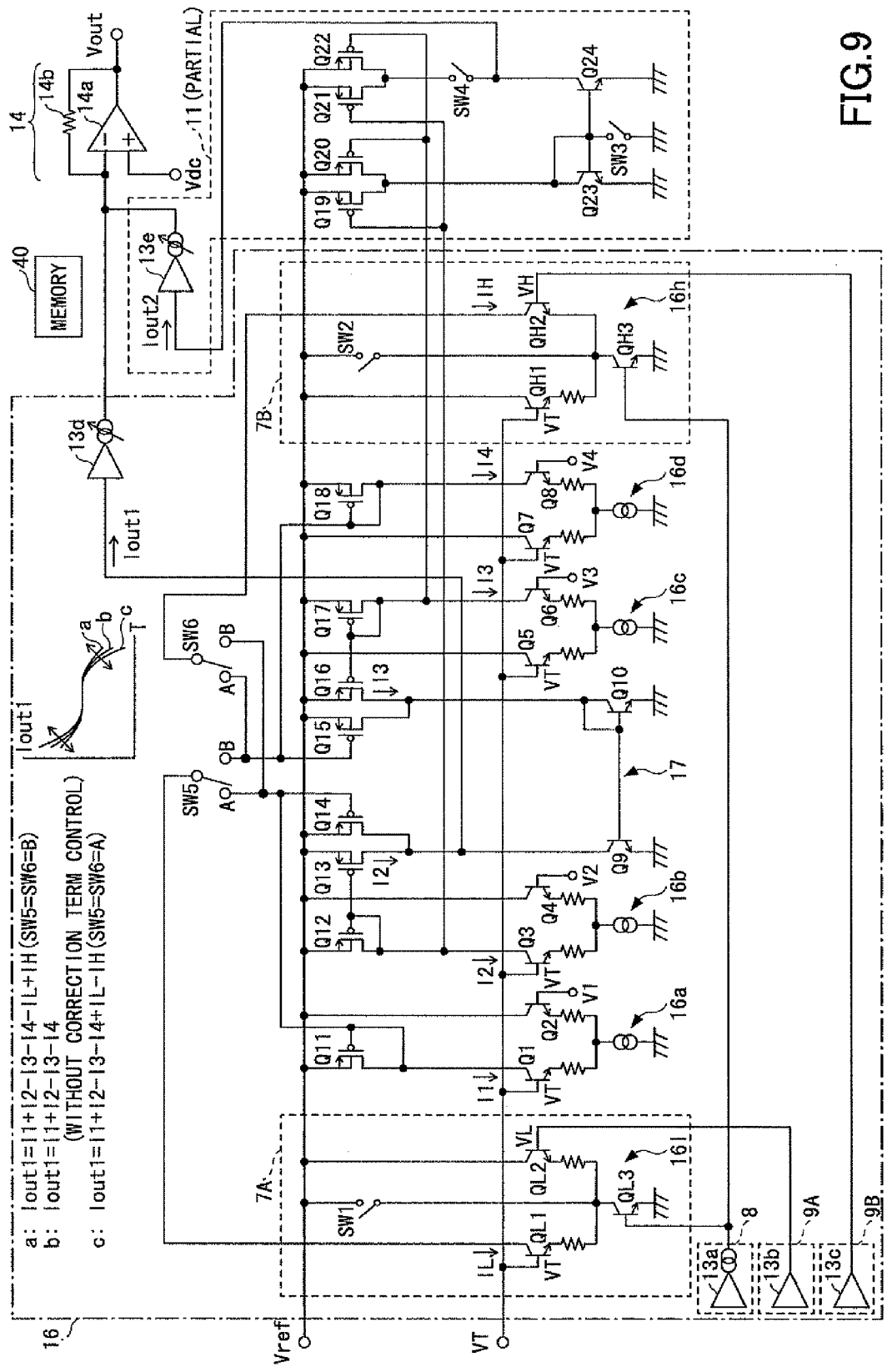
FIG. 9 is a circuit diagram of a third-order component generating circuit, a second-order component generating circuit, and a correction term circuit.

FIG. 9 is a circuit diagram of the third-order component generating circuit 16, the second-order component generating circuit 11, and the correction term circuit 10. The correction term circuit 10 includes the correction voltage generating circuit 7 (7A, 7B), the slope angle adjusting circuit 8, and the correction range adjusting circuit 9 (9A, 9B). In FIG. 9, Qx indicates a transistor. Each transistor may be implemented by a metal oxide semiconductor (MOS) transistor or a bipolar transistor. Here, detailed circuit configurations and descriptions of operations of the reference voltage generating circuit 1, the temperature detecting circuit 2, the T0 adjusting circuit 3, the zeroth-order component generating circuit 4, and the first-order component generating circuit 5 are omitted. Any known configurations may be used for those circuits.

The third-order component generating circuit 16 includes differential amplifier circuits 16a through 16d and a signal combining circuit 17 that outputs a signal obtained by combining output signals from the differential amplifier circuits 16a through 16d. The differential amplifier circuits 16a and 16b output low-temperature-side adjusting currents I1 and I2 for adjusting the third-order component Vc3 of the control voltage Vc in a lower part of the normal temperature range that is lower than the inflection point temperature T0. The differential amplifier circuits 16c and 16d output high-temperature-side adjusting currents I3 and I4 for adjusting the third-order component Vc3 of the control voltage Vc in a higher part of the normal temperature range that is higher than the inflection point temperature T0.

The differential amplifier circuit 16a includes a differential pair (Q1, Q2) to which a detection voltage VT from the temperature detecting circuit 2 and a reference voltage V1 generated based on the reference voltage Vref are input. The differential amplifier circuit 16b includes a differential pair (Q3, Q4) to which the detection voltage VT from the temperature detecting circuit 2 and a reference voltage V2 generated based on the reference voltage Vref are input. The differential amplifier circuit 16c includes a differential pair (Q5, Q6) to which the detection voltage VT from the temperature detecting circuit 2 and a reference voltage V3 generated based on the reference voltage Vref are input. The differential amplifier circuit 16d includes a differential pair (Q7, Q8) to which the detection voltage VT from the temperature detecting circuit 2 and a reference voltage V4 generated based on the reference voltage Vref are input.

A low-temperature-side correction voltage generating circuit 7A of the correction voltage generating circuit 7 includes a differential amplifier circuit 16l that outputs a low-temperature-side correction current IL for correcting the control voltage Vc in a low-temperature range that is lower than the normal temperature range. Currents to be combined with the low-temperature-side correction current IL are switched by a switch SW5 according to the data stored in the memory 40. Whether to output the low-temperature-side correction current IL is controlled by a switch SW1 according to the data stored in the memory 40. Accordingly, when the switch SW1 is turned on, outputting of the low-temperature-side correction current IL is prevented and the function of the low-temperature-side correction voltage generating circuit 7A is disabled. Meanwhile, when the switch SW1 is turned off, the low-temperature-side correction current IL is output and the function of the low-temperature-side correction voltage generating circuit 7A is enabled. A high-temperature-side correction voltage generating circuit 7B of the correction voltage generating circuit 7 includes a differential amplifier circuit 16h that outputs a high-temperature-side correction current IH for correcting the control voltage Vc in a high-temperature range that is higher than the normal temperature range. Currents to be combined with the high-temperature-side correction current IH are switched by a switch SW6 according to the data stored in the memory 40. Whether to output the high-temperature-side correction current IH is controlled by a switch SW2 according to the data stored in the memory 40. Accordingly, when the switch SW2 is turned on, outputting of the high-temperature-side correction current IH is prevented and the function of the high-temperature-side correction voltage generating circuit 7B is disabled. Meanwhile, when the switch SW2 is turned off, the high-temperature-side correction current IH is output and the function of the high-temperature-side correction voltage generating circuit 7B is enabled.

The differential amplifier circuit 16l includes a differential pair (QL1, QL2) to which the detection voltage VT from the temperature detecting circuit 2 and a reference voltage VL from a low-temperature-side correction range adjusting circuit 9A of the correction range adjusting circuit 9 are input. The differential amplifier circuit 16h includes a differential pair (QH1, QH2) to which the detection voltage VT from the temperature detecting circuit 2 and a reference voltage VH from a high-temperature-side correction range adjusting circuit 9B of the correction range adjusting circuit 9 are input.

The slope angle adjusting circuit 8 includes a constant-current adjusting circuit 13a that adjusts the current values of constant currents to be applied to the differential pair (QL1, QL2) of the differential amplifier circuit 16l and the differential pair (QH1, QH2) of the differential amplifier circuit 16h according to the data stored in the memory 40. For example, the constant-current adjusting circuit 13a adjusts the current value of the constant current to be applied to the differential pair (QL1, QL2) using a DA converter and a transistor QL3 that receives an output from the DA converter, and adjusts the current value of the constant current to be applied to the differential pair (QH1, QH2) using a DA converter and a transistor QH3 that receives an output from the DA converter.

The low-temperature-side correction range adjusting circuit 9A includes a voltage adjusting circuit 13b that adjusts the voltage value of the reference voltage VL using, for example, a DA converter according to the data stored in the memory 40. The high-temperature-side correction range adjusting circuit 9B includes a voltage adjusting circuit 13c that adjusts the voltage value of the reference voltage VH using, for example, a DA converter according to the data stored in the memory 40.

The signal combining circuit 17 includes a current mirror composed of a pair of transistors (Q9, Q10) that generates a combined current Iout1 by combining output currents from the differential amplifier circuits 16a through 16d and outputs the combined current Iout1 to a DA converter 13d.

Figure 11:
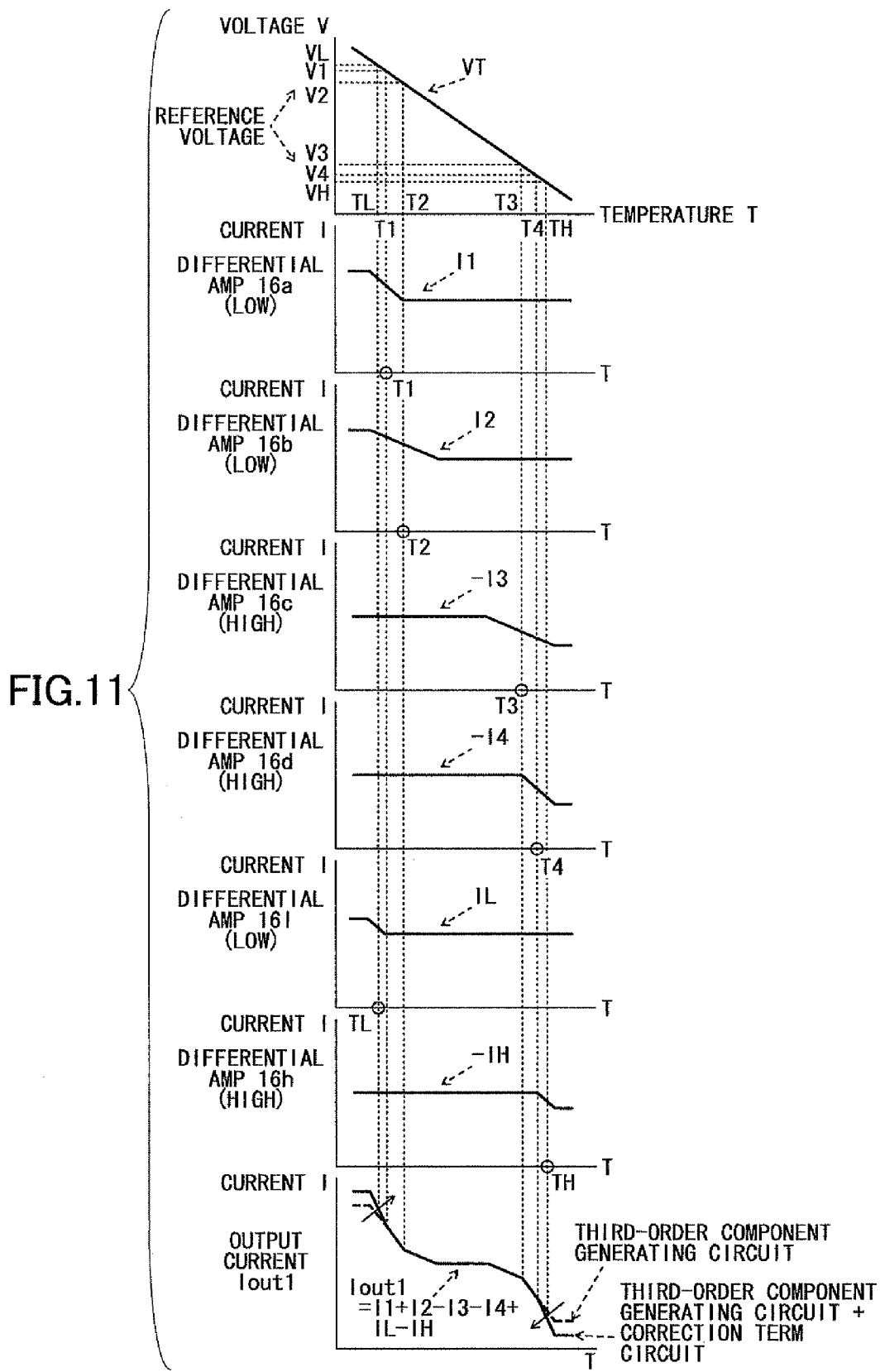
FIG. 11 is a drawing illustrating temperature characteristics of currents I1-I4, IL, and IH, a detection voltage VT, and a combined current Iout1.

FIG. 11 illustrates temperature characteristics of the currents I1-I4, IL, and IH, the detection voltage VT, and the combined current Iout1. The inflection point temperature T0 is between a temperature T2 and a temperature T3. Relationships in magnitude among reference voltages and temperatures are illustrated in FIG. 11. The reference voltage VH is lower than any one of the reference voltages V1-V4 input to the differential amplifier circuits 16a-16d of the third-order component generating circuit 16. The reference voltage VL is higher than any one of the reference voltages V1-V4.

The reference voltage V2 is obtained by substituting the temperature T2 lower than the inflection point temperature T0 in a first-order approximation formula representing the negative linear temperature characteristic of the detection voltage VT. The reference voltages V1 and VL may also be obtained in a similar manner. The reference voltage V3 is obtained by substituting the temperature T3 higher than the inflection point temperature T0 in the first-order approximation formula representing the negative linear temperature characteristic of the detection voltage VT. The reference voltages V4 and VH may also be obtained in a similar manner.

Figure 14:
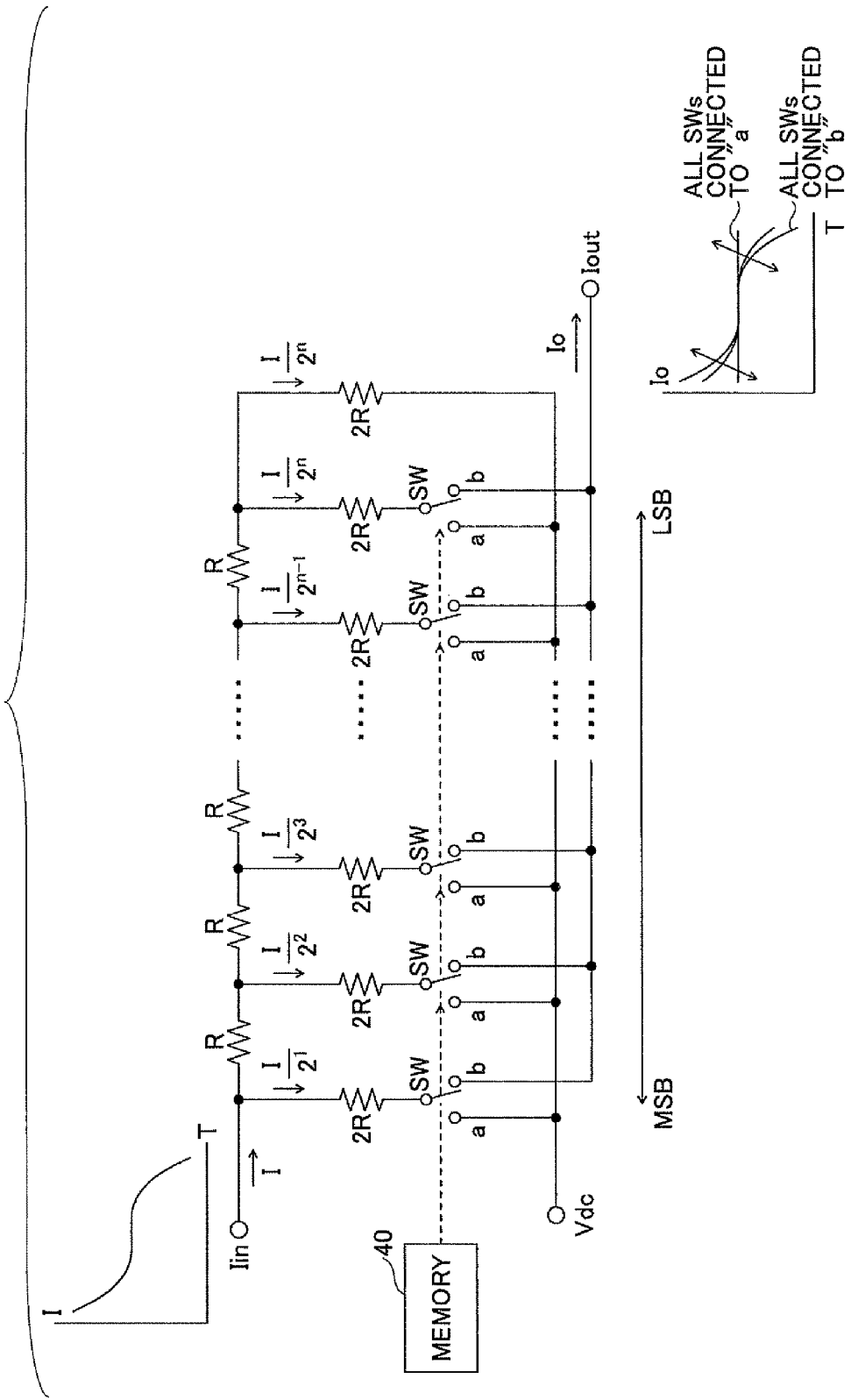
FIG. 14 is a drawing illustrating an exemplary configuration of a DA converter.

The third-order component Vc3 of the control voltage Vc is generated by converting the combined current Iout1 into an equivalent voltage by a current-voltage conversion unit. In FIG. 9, the DA converter 13d and an amplifier circuit 14 constitute the current-voltage conversion unit. The amplifier circuit 14 includes an operational amplifier 14a and a resistor 14b connecting an inverting input terminal and an output terminal of the operational amplifier 14a. An output voltage (output current) from the DA converter 13d is input to the inverting input terminal of the operational amplifier 14a. Meanwhile, a reference voltage Vdc is input to a non-inverting input terminal of the operational amplifier 14a. The output value of the DA converter 13d is adjusted according to the data stored in the memory 40. FIG. 14 is a drawing illustrating an exemplary configuration of the DA converter 13d. DA converters other than the DA converter 13d in FIG. 9 may also have a configuration similar to that illustrated in FIG. 14.

Figure 12:
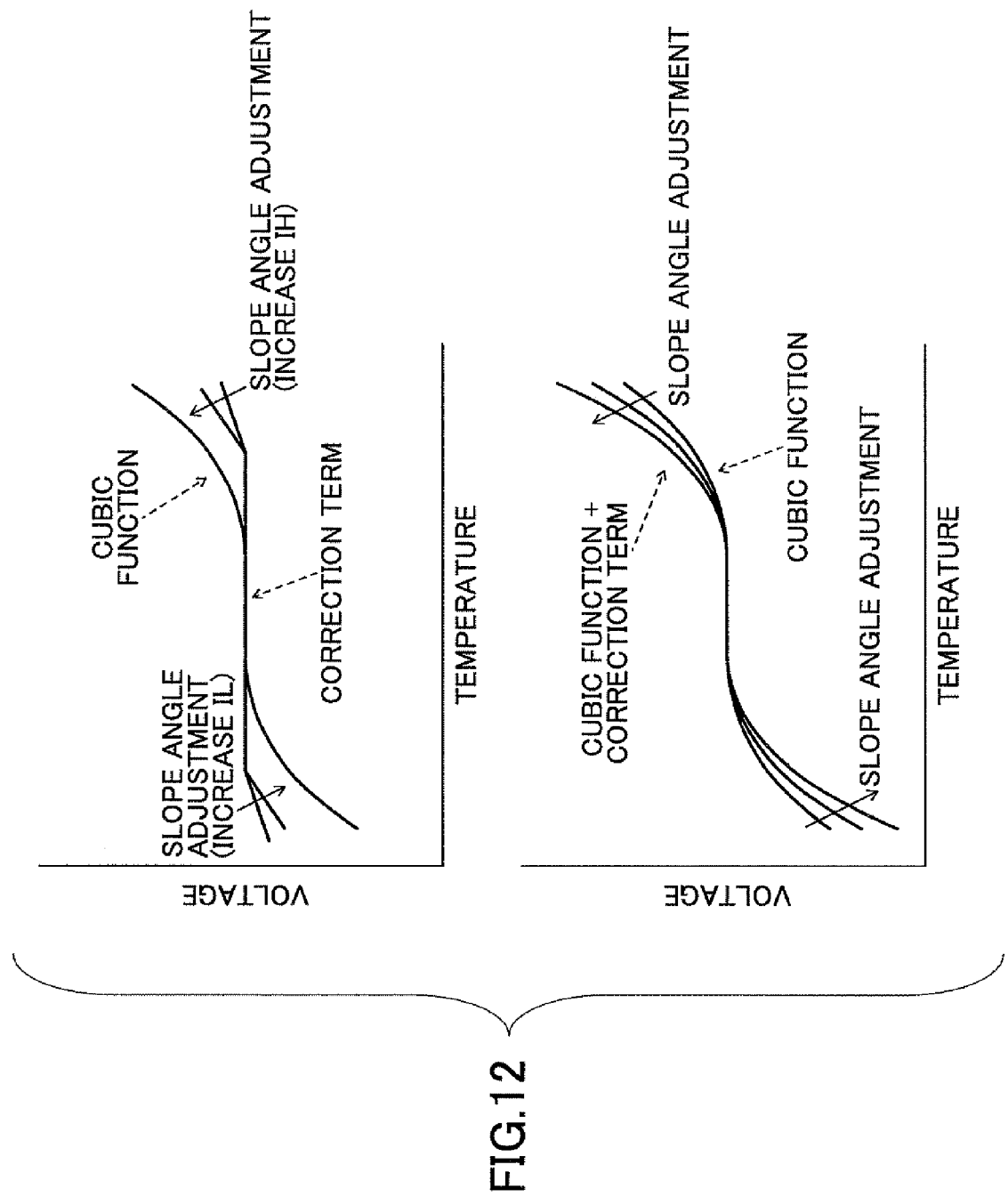
FIG. 12 is a drawing used to describe adjustment of slope angles of a control voltage.
Figure 13:
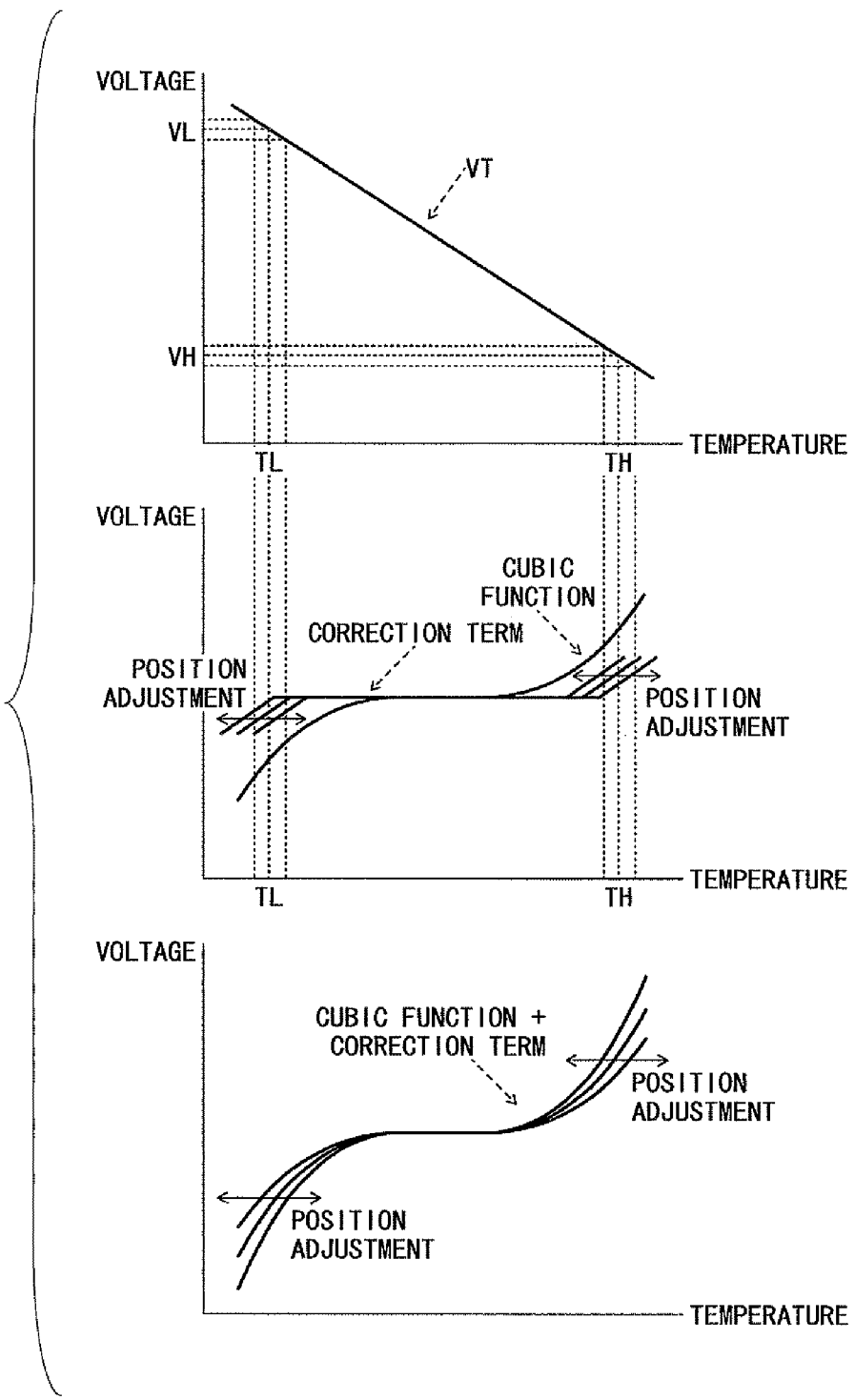
FIG. 13 is a drawing used to describe adjustment of positions of slope change points of a control voltage.

The constant-current adjusting circuit 13a makes it possible to adjust the current value(s) of the constant current(s) to be applied to the differential pair (QL1, QL2) of the differential amplifier circuit 16l and/or the differential pair (QH1, QH2) of the differential amplifier circuit 16h and thereby makes it possible to adjust the slope angle(s) of the control voltage Vc as illustrated in FIG. 12. The voltage adjusting circuits 13b and 13c make it possible to adjust one or both of the reference voltages VH and VL and thereby make it possible to adjust the position(s) of the slope change point(s) of the control voltage Vc as illustrated in FIG. 13.

Thus, adding the correction term circuit 10 makes it possible to increase the temperature range where temperature compensation can be accurately performed both in the low-temperature side and the high-temperature side.

Meanwhile, the temperature compensating circuit 21 also includes the second-order component generating circuit 11 as illustrated in FIG. 4. As one feature of the temperature compensating circuit 21, the second-order component generating circuit 11 and the third-order component generating circuit 16 share some differential amplifier circuits.

Figure 10:
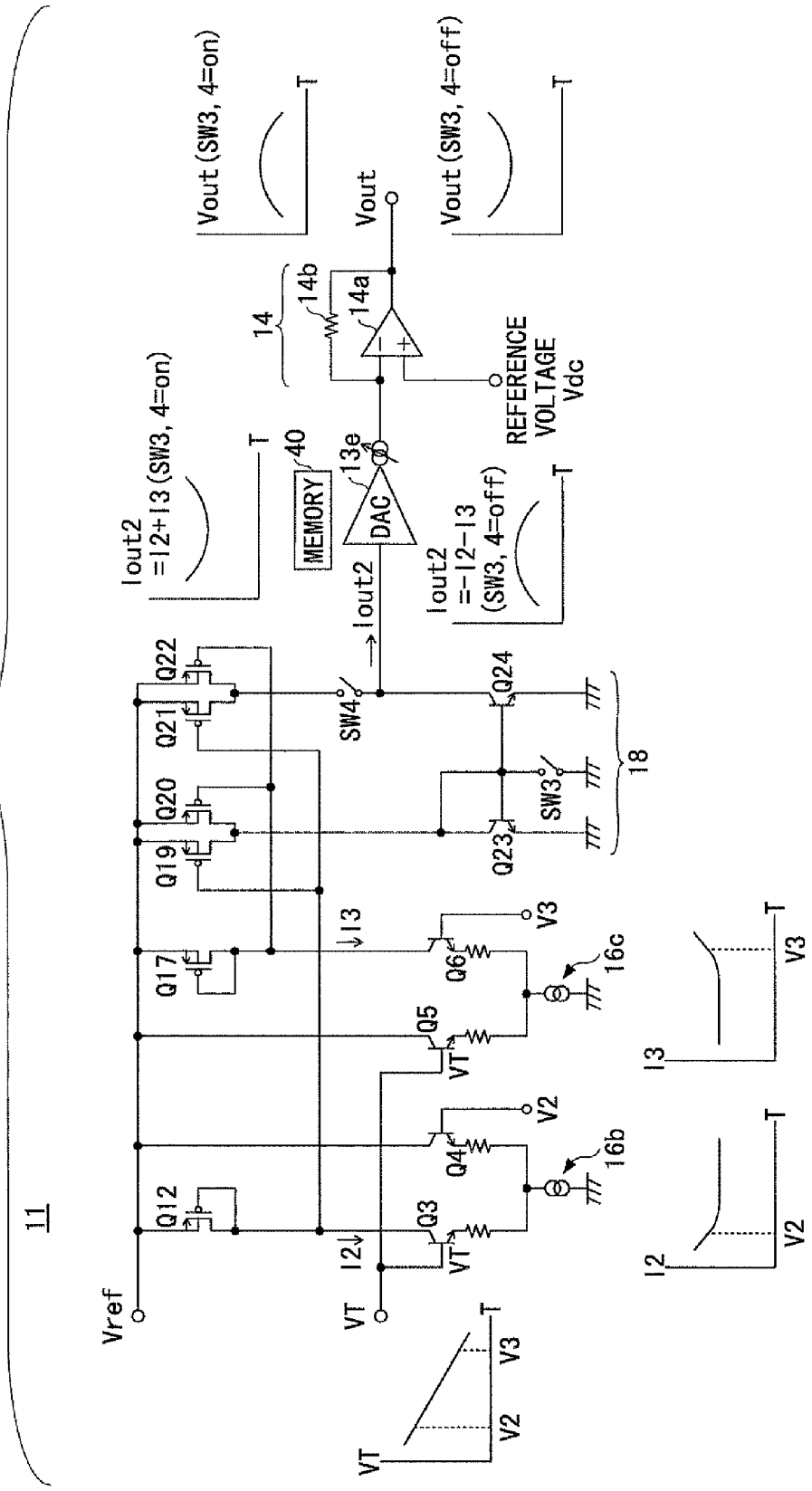
FIG. 10 is a drawing illustrating an exemplary configuration of a second-order component generating circuit.

FIG. 10 is a drawing illustrating an exemplary configuration of the second-order component generating circuit 11. In this example, the second-order component generating circuit 11 and the third-order component generating circuit 16 share the differential amplifier circuits 16b and 16c. The second-order component generating circuit 11 includes a current output circuit 18 that selectively outputs one of a first combined current obtained by combining the low-temperatureside adjusting current I2 from the differential amplifier circuit 16b and the high-temperature-side adjusting current I3 from the differential amplifier circuit 16c and a second combined current that is opposite to the first combined current and has the same current value. In FIG. 10, Qx indicates a transistor. Each transistor may be implemented by a (metal oxide semiconductor) MOS transistor or a bipolar transistor.

When both of switches SW3 and SW4 are turned on, no current flows from transistors Q19 and Q20 but a current flows from transistors Q21 and Q22. In this case, the current output circuit 18 outputs a first combined current Iout2 (=I2+I3). Meanwhile, when both of the switches SW3 and SW4 are turned off, a current flows from the transistors Q19 and Q20 but no current flows from the transistors Q21 and Q22. In this case, the current output circuit 18 outputs a second combined current Iout2 (=−(I2+I3)). The switches SW3 and SW4 are turned on and off according to the data stored in the memory 40.

The second-order component Vc2 of the control voltage Vc is generated by converting the combined current Iout2 into an equivalent voltage by a current-voltage converting unit. In FIG. 10, a DA converter 13e and the amplifier circuit 14 constitute the current-voltage conversion unit. The output value of the DA converter 13e is adjusted according to the data stored in the memory 40.

Thus, the second-order component generating circuit 11 makes it possible to generate the second-order component Vc2 of the control voltage Vc. Also with the second-order component generating circuit 11, it is possible to invert the polarity of the second-order component Vc2 as illustrated in FIG. 10 by turning on and off the switches SW3 and SW4. In other words, it is possible to change whether to add or subtract the second-order component Vc2 by turning on and off the switches SW3 and SW4. Also, the value of the second-order component Vc2 can be adjusted by the DA converter 13e.

Figure 3:
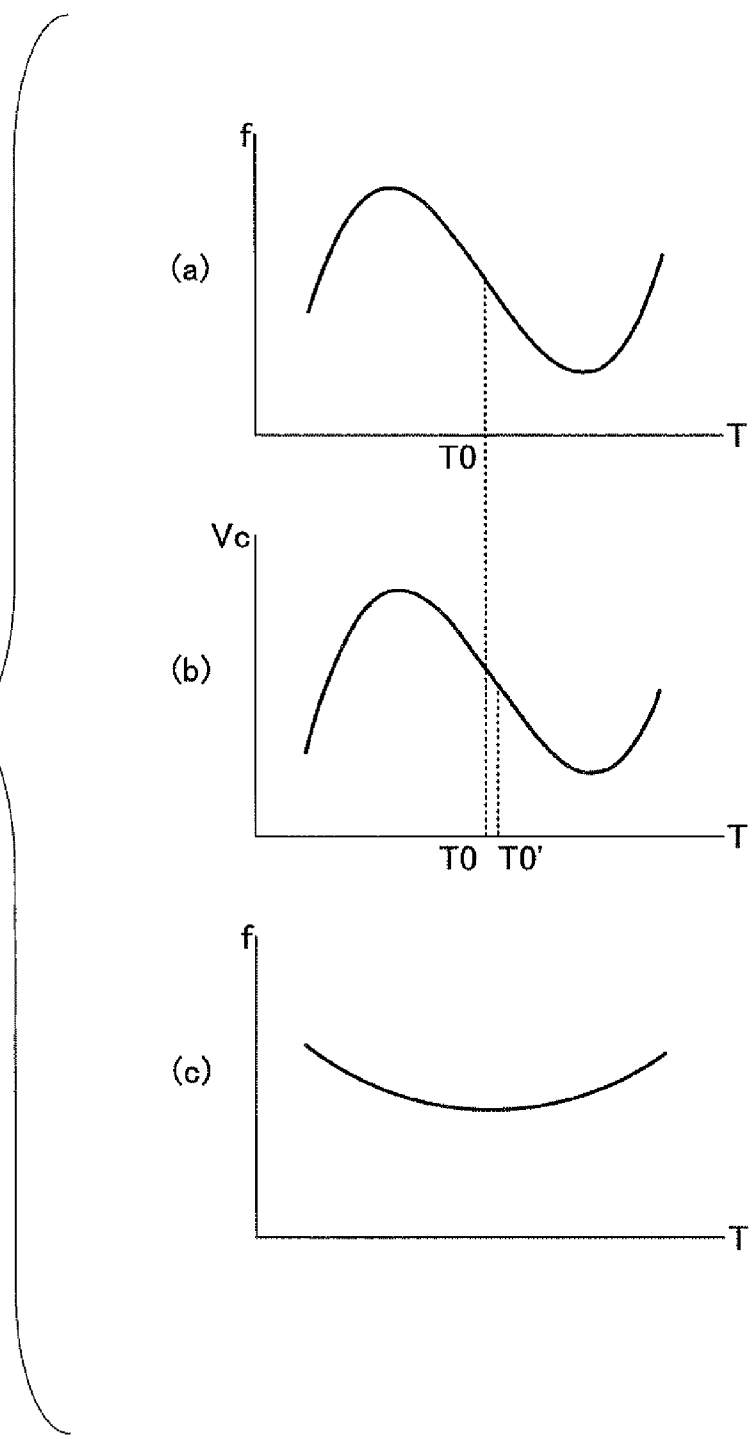
FIG. 3 is a drawing used to describe a shift of temperature at an inflection point and a resulting second-order component in an oscillation frequency.

Adding the second-order component generating circuit 11 separately from the T0 adjusting circuit 3 for adjusting the inflection point temperature T0 makes it possible to accurately compensate for (or cancel) a shift of the inflection point temperature T0 (see FIG. 3 (c)) caused by manufacturing variations of an integrated circuit (i.e., the TCXO 100). The T0 adjusting circuit 3 adjusts the inflection point temperature T0 to a designed value, i.e., a temperature at the inflection point that is determined according to the temperature characteristic of the quartz crystal 35. However, even if the inflection point temperature T0 is adjusted by the T0 adjusting circuit 3, the inflection point temperature T0 may be shifted to the high-temperature side or the low-temperature side (T0') due to process variation. The second-order component generating circuit 11 compensates for the shift such that T0' matches T0 according to the data stored in the memory 40. Adjustment data provided for each product (i.e., product-specific adjustment data) to adjust the inflection point temperature from T0' to T0 may be stored in the memory 40 before the shipment. Also with the above described configuration, the third-order component generating circuit 16 and the second-order component generating circuit 11 share some differential amplifier circuits. This configuration makes it possible to prevent an increase in the circuit size even when the second-component generating circuit 11 is added.

Figure 15:
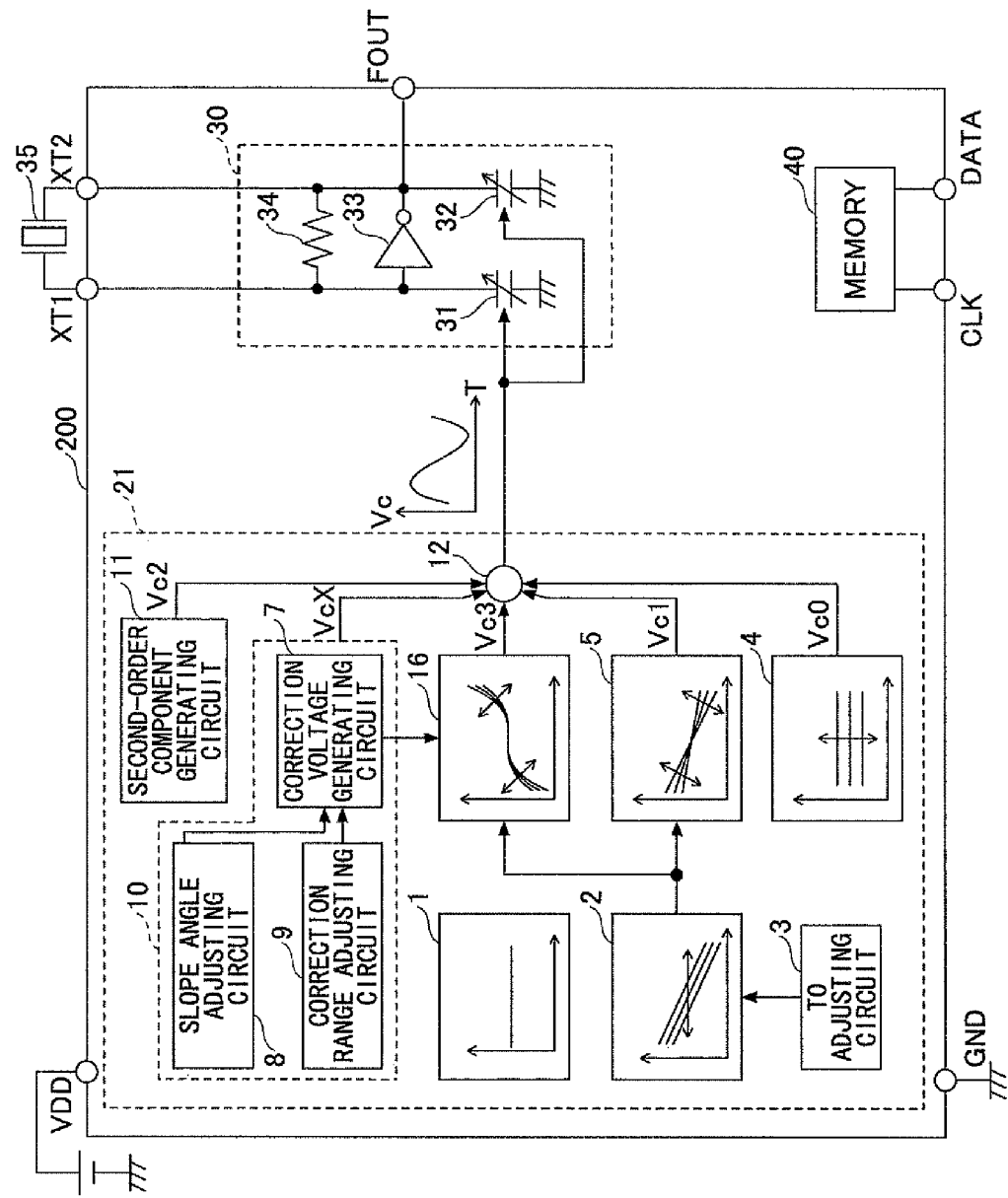
FIG. 15 is a drawing illustrating an exemplary configuration of a temperature-compensated crystal oscillator according to a second embodiment.

FIG. 15 is a drawing illustrating an exemplary configuration of a temperature-compensated crystal oscillator (TCXO) 200 according to a second embodiment. In the configuration of FIG. 15, the correction term circuit 10 is a higher-order component generating circuit that generates a higher-order voltage component VcX of an order higher than the order of the third-order component Vc3 generated by the third-order component generating circuit 16. The configuration of the third-order component generating circuit 16 of FIG. 15 is different from that of FIG. 4 in that the third-order component generating circuit 16 does not include the correction voltage generating circuit 7, the slope angle adjusting circuit 8, and the correction range adjusting circuit 9. Instead, these circuits are included in the correction term circuit 10 provided separately from the third-order component generating circuit 16. The correction term circuit 10 generates the higher-order voltage component VcX according to the data stored in the memory 40. The adder-subtractor 12 obtains a sum of the zeroth-order component Vc0, the first-order component Vc1, the third-order component Vc3, and the higher-order voltage component VcX, adds or subtracts the second-order component Vc2 to or from the sum to obtain the control voltage Vc, and outputs the obtained control voltage Vc to the oscillating circuit 30. Configurations and operations of other components of the TCXO 200 are substantially the same as those in FIG. 4 and therefore their descriptions are omitted here. The second embodiment provides advantageous effects similar to those provided by the first embodiment.

Preferred embodiments of the present invention are described above. However, the present invention is not limited to the specifically disclosed embodiments, and variations and modifications may be made without departing from the scope of the present invention.

What is claimed is:

1. A function generator circuit for outputting a control signal to an oscillating circuit that causes a quartz crystal to oscillate, the function generator circuit comprising:
    an adjusting circuit configured to adjust a temperature at an inflection point of the control signal to match a temperature at the inflection point determined by a temperature characteristic of the quartz crystal;
    a temperature detecting circuit configured to output a detection voltage corresponding to an ambient temperature and having a linear temperature characteristic;
    a zeroth-order component generating circuit configured to generate a zeroth-order component of the control signal;
    a first-order component generating circuit configured to generate a first-order component of the control signal;
    a second-order component generating circuit configured to generate a second-order component of the control signal;
    a third-order component generating circuit configured to generate a third-order component of the control signal based on the detection voltage; and
    an adder-subtractor configured to generate the control signal by obtaining a sum of the zeroth-order component, the first-order component, and the third-order component and adding or subtracting the second-order component to or from the sum,
    wherein the second-order component generating circuit is configured to correct the temperature at the inflection point of the control signal adjusted by the adjusting circuit to match the temperature at the inflection point determined by the temperature characteristic of the quartz crystal according to product-specific adjustment data.

2. The function generator circuit as claimed in claim 1, wherein the third-order component generating circuit includes a third-order component correction circuit configured to correct the third component.

3. The function generator circuit as claimed in claim 2, wherein the third-order component correction circuit is configured to generate a correction component for correcting the third-order component in a high temperature range higher than 80° C. and in a low temperature range lower than −30° C.

4. The function generator circuit as claimed in claim 3, wherein the third-order component generating circuit includes a slope angle adjusting circuit configured to correct a slope angle of the correction component.

5. The function generator circuit as claimed in claim 3, wherein the third-order component generating circuit includes a correction range adjusting circuit configured to adjust a temperature range where the correction component is generated.

6. A function generator circuit for outputting a control signal to an oscillating circuit that causes a quartz crystal to oscillate, the function generator circuit comprising:
    an adjusting circuit configured to adjust a temperature at an inflection point of the control signal to match a temperature at the inflection point determined by a temperature characteristic of the quartz crystal;
    a temperature detecting circuit configured to output a detection voltage corresponding to an ambient temperature and having a linear temperature characteristic;
    a zeroth-order component generating circuit configured to generate a zeroth-order component of the control signal;
    a first-order component generating circuit configured to generate a first-order component of the control signal;
    a second-order component generating circuit configured to generate a second-order component of the control signal;
    a third-order component generating circuit configured to generate a third-order component of the control signal based on the detection voltage;
    a higher-order component generating circuit configured to generate a higher-order component higher than the third-order component; and
    an adder-subtractor configured to generate the control signal by obtaining a sum of the zeroth-order component, the first-order component, the third-order component, and the higher-order component and adding or subtracting the second-order component to or from the sum,
    wherein the second-order component generating circuit is configured to correct the temperature at the inflection point of the control signal adjusted by the adjusting circuit to match the temperature at the inflection point determined by the temperature characteristic of the quartz crystal according to product-specific adjustment data.

7. The function generator circuit as claimed in claim 6, wherein the higher-order component generating circuit is configured to generate the higher-order component in a high temperature range higher than 80° C. and in a low temperature range lower than −30° C.

8. The function generator circuit as claimed in claim 6, wherein the higher-order component generating circuit includes a slope angle adjusting circuit configured to correct a slope angle of the higher-order component.

9. The function generator circuit as claimed in claim 6, wherein the higher-order component generating circuit includes a correction range adjusting circuit configured to adjust a temperature range where the higher-order component is generated.

10. A crystal oscillation circuit, comprising:
    an oscillating circuit configured to cause a quartz crystal to oscillate; and
    the function generator circuit as claimed in claim 1.

11. A crystal oscillator, comprising:
    a quartz crystal; and
    the crystal oscillation circuit as claimed in claim 10.

12. A crystal oscillation circuit, comprising:
    an oscillating circuit configured to cause a quartz crystal to oscillate; and
    the function generator circuit as claimed in claim 6.

13. A crystal oscillator, comprising:
    a quartz crystal; and
    the crystal oscillation circuit as claimed in claim 12.

* * * * *